United States Patent
Norris et al.

(10) Patent No.: US 7,463,548 B2
(45) Date of Patent: Dec. 9, 2008

(54) METHOD FOR PERFORMING A BURN-IN TEST

(75) Inventors: Alan D. Norris, Hinesburg, VT (US); Samuel Weinstein, Cambridge, MA (US); Stephan Wuensche, San Jose, CA (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 26 days.

(21) Appl. No.: 11/687,694

(22) Filed: Mar. 19, 2007

(65) Prior Publication Data

US 2007/0165481 A1    Jul. 19, 2007

Related U.S. Application Data

(62) Division of application No. 10/605,927, filed on Nov. 6, 2003, now Pat. No. 7,243,276.

(51) Int. Cl.
  *G11C 8/16* (2006.01)
(52) U.S. Cl. .................... 365/233.13; 365/233.18; 365/233.1; 365/203
(58) Field of Classification Search ............ 365/233.18, 365/233.22, 233.03, 233.13
See application file for complete search history.

(56) References Cited

U.S. PATENT DOCUMENTS

| | | | |
|---|---|---|---|
| 6,489,819 B1 * | 12/2002 | Kono et al. | 365/233.11 |
| 6,496,429 B2 | 12/2002 | Murai et al. | |
| 6,552,951 B1 | 4/2003 | Raj et al. | |
| 6,794,678 B2 * | 9/2004 | Hasegawa et al. | 365/201 |
| 6,819,610 B2 | 11/2004 | Miyo et al. | |
| 6,853,597 B2 | 2/2005 | Jain | |
| 6,914,841 B1 | 7/2005 | Thwaite | |
| 2003/0063517 A1 | 4/2003 | Jain | |

* cited by examiner

*Primary Examiner*—Thong Q Le
(74) *Attorney, Agent, or Firm*—Schmeiser, Olsen & Watts; Steven Capella

(57) ABSTRACT

A DDR DRAM having a test mode and an operational mode and a method for testing the DDR DRAM. The method includes in the order recited: (a) placing the DDR DRAM in test mode; (b) issuing a bank activate command to select and bring up a wordline selected for write of the DDR DRAM; (c) writing with auto-precharge, a test pattern to cells of the DDR DRAM; (d) repeating steps (b) and (c) until all wordlines for write have been selected; (e) issuing a bank activate command to select and bring up a wordline selected for read of the DDR DRAM; (f) reading with auto-precharge, the stored test pattern from cells of the DDR DRAM; and (g) repeating steps (e) and (f) until all wordlines for read have been selected.

6 Claims, 4 Drawing Sheets

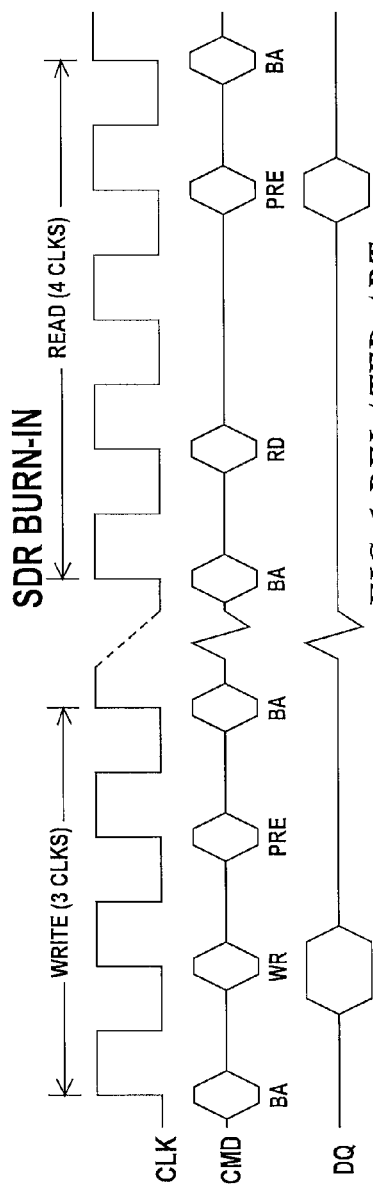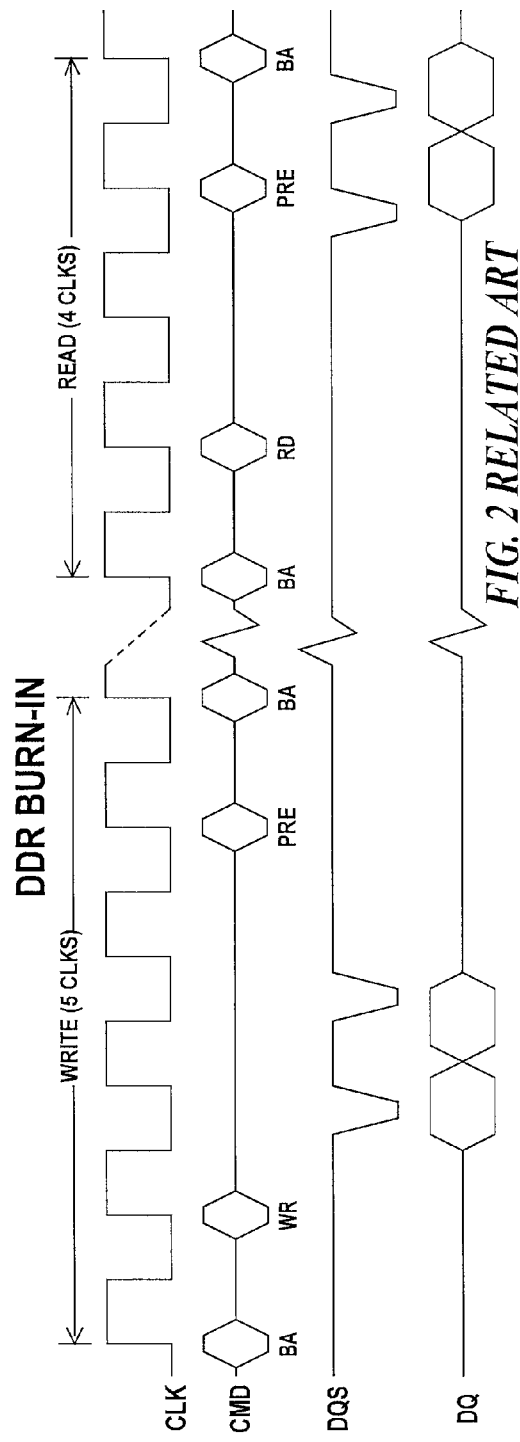
FIG. 1 RELATED ART
FIG. 2 RELATED ART

METHOD FOR PERFORMING A BURN-IN TEST

RELATED APPLICATIONS

This Application is a division of U.S. patent application Ser. No. 10/605,927 filed on Nov. 6, 2003.

FIELD OF THE INVENTION

The present invention relates to the field of integrated circuits; more specifically, it relates to double data rate (DDR) dynamic random access memory (DRAM) burn-in testing.

BACKGROUND OF THE INVENTION

Two main types of DRAMs are, single data rate (SDR) and a double data rate (DDR). In SDR mode, data comes out of the DRAM on a rising clock edge. In DDR mode, data is delivered externally on both a rising and falling clock edge. Furthermore, DDR architecture requires a two clock internal write latency (the number of clocks of delay from when the write command is issued to the DRAM externally until the column select is activated in the DRAM array), while SDR requires no internal write latency. Insitu burn-in testing of a DRAM in DDR mode, therefore, takes a significantly longer time than in SDR mode and can exceed the retention time specification of the DRAM cell, generating false fails. Current testing methods of dual mode (SDR and DDR) DRAMs therefore rely only on insitu burn-in testing of the DRAM in SDR mode. However, for DRAMs having only DDR mode circuitry, insitu burn-in testing is problematical. Therefore, a method of insitu pattern burn-in testing of DDR mode only DRAMs is required.

SUMMARY OF THE INVENTION

A first aspect of the present invention is a method for testing a DDR DRAM having a test mode and an operational mode, comprising in the order recited: (a) placing the DDR DRAM in test mode; (b) issuing a bank activate command to select and bring up a wordline selected for write of the DDR DRAM; (c) writing with auto-precharge, a test pattern to cells of the DDR DRAM; (d) repeating steps (b) and (c) until all wordlines for write have been selected; (e) issuing a bank activate command to select and bring up a wordline selected for read of the DDR DRAM; (f) reading with auto-precharge, the stored test pattern from cells of the DDR DRAM; and (g) repeating steps (e) and (f) until all wordlines for read have been selected.

A second aspect of the present invention is a DDR DRAM having a low frequency and a high frequency operating mode, comprising: a multiplicity of storage cells arranged in an array, each storage cell accessible by a wordline and a bitline; and wherein peripheral logic circuits of the DDR DRAM are adapted to execute a write burst enable and a column address command one clock cycle earlier in low frequency operating mode than in high frequency operating mode, adapted to execute an auto-precharge enable one-half clock cycle earlier in low frequency operating mode than in high frequency operating mode, and having a column address latency of one clock cycle in test mode and two or three clock cycles in operational mode.

A third aspect of the present invention is a computer system comprising a processor, an address/data bus coupled to the processor, and a computer-readable memory unit adapted to be coupled to the processor, the memory unit containing instructions that when executed by the processor implement a method for testing a DDR DRAM having a test mode and an operational mode, the method comprising the computer implemented steps of, in the order recited: (a) placing the DDR DRAM in test mode; (b) issuing a bank activate command to select and bring up a wordline selected for write of the DDR DRAM; (c) writing with auto-precharge, a test pattern to cells of the DDR DRAM; (d) repeating steps (b) and (c) until all wordlines for write have been selected; (e) issuing a bank, activate command to select and bring up a wordline selected for read of the DDR DRAM; (f) reading with auto-precharge, the stored test pattern from cells of the DDR DRAM; and (g) repeating steps (e) and (f) until all wordlines for read have been selected.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 1 is a timing diagram for a related art method of performing a pattern burn-in test of a DRAM in SDR mode;

FIG. 2 is a timing diagram for a related art method of performing a pattern burn-in test of a DRAM in DDR mode;

DETAILED DESCRIPTION OF THE INVENTION

Figure 3:
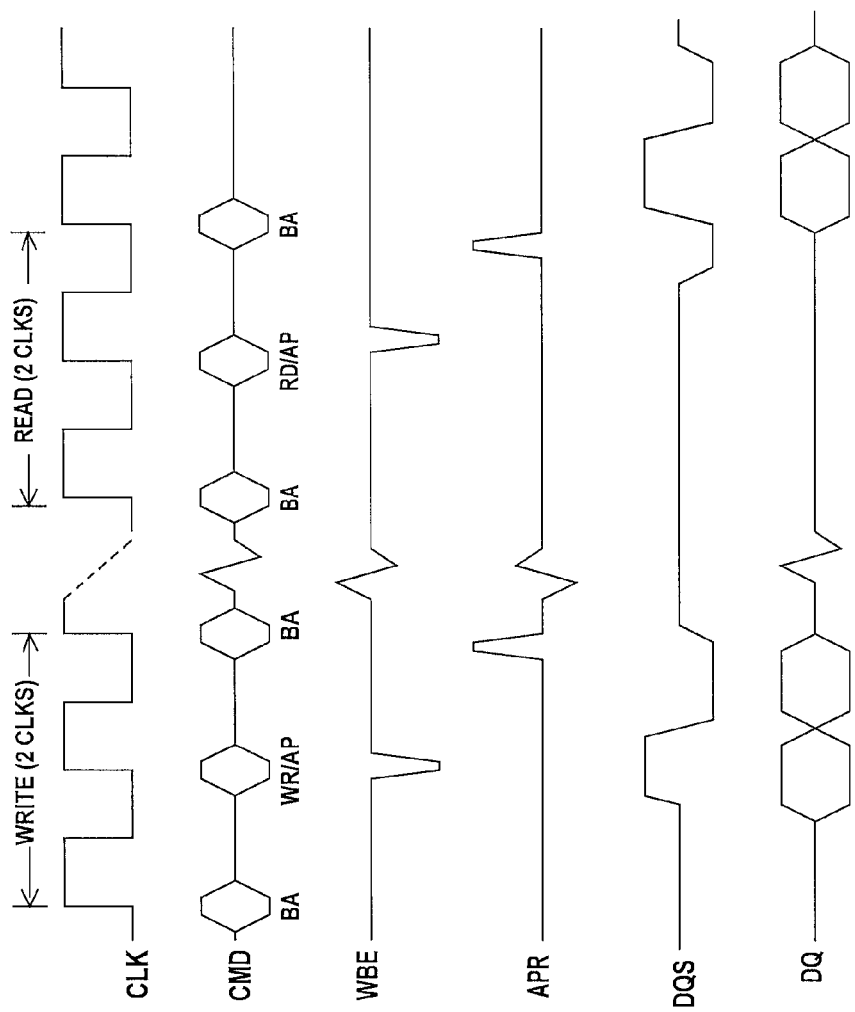
FIG. 3 is a timing diagram for a method of performing a pattern burn-in test of a DRAM in DDR mode according to the present invention.

Cells in a DRAM are arranged in a two dimensional matrix, with rows being accessed by wordlines and columns being accessed by bitlines. A typical DRAM cell consists of an N channel field effect transistor (NFET) transistor and a storage node (usually a capacitor). The gate of the NFET is connected to a wordline, the drain to a bitline, the source to a first plate of the capacitor and the second plate of the capacitor is connected to a low voltage, usually to ground. Sense amplifiers on each bitline sense the presence of stored charge (a logical 1) on the storage node of a DRAM cell when that cells wordline is turned on.

Operation of a DRAM in SDR/DDR mode is covered in the JEDEC Standards SDRAM3_11_05/JESD97 specification. The circuit design to meet this specification varies from manufacturer to manufacturer.

Burn-in testing of DRAMs is designed to provide accelerated fail of cells during test that would otherwise fail subsequently. Acceleration is accomplished by performing the test at elevated temperature, typically about 140° C. or 180° C., and when many DRAMs are tested in parallel, slows down I/O operations. However this slows down operation of the DRAM, so a slow clock time is used. An example of a slow clock time is 120 ns or 0.83 MHz, even though the DRAM may be designed for higher frequency operation, for example 100 MHz (10 ns CLK) or higher. Any slow clock time of less than 100% of the normal CLK time may be used. Burn-in insitu stress pattern test is performed by writing patterns into the DRAM cells and then reading out the DRAM cells some time later. First all cells are written and then all cells are read. If the input pattern does not match the output pattern, a fail has occurred.

FIG. 1 is a timing diagram for a related art method of performing a pattern burn-in test of a DRAM in SDR mode. In FIG. 1, each write sequence takes three clock cycles. A bank activate (BA) command is issued on the rising edge of the first clock and data (designated by signal DQ) is presented and a write (WR) command is issued and the data latched at the rising edge of the second clock cycle. At the rising edge of the third clock cycle, a precharge (PRE command) is issued. A BA command brings up a single wordline. A WR command places data on the bitlines, and a PRE command, precharges the bitline to a known state so the bitline is ready for the next WR command.

After all cells have been written, they are read out. Each read sequence takes four clock cycles. At the rising edge of the first clock, a BA command is issued and at the rising edge of the second clock a read (RD) command is issued. However, data is not present at the output of the DRAM until the rising edge of the fourth clock. This is read column address select (CAS) latency of the DRAM. A PRE command is issued on the rising edge of the fourth clock (after the data has been sensed) so the bitline is in a known state and ready for the next RD command.

An important consideration is the retention time of the DRAM cell. Since all DRAM cells are written sequentially and then read sequentially, the amount of time data written to each cell can exceed the retention time of the DRAM cell. For example given a 120 ns clock cycle, 8192 wordlines, a 3 clock write cycle and a 4 clock read cycle, data in the very first DRAM cell written has been held by that cell for about 2.95 milliseconds (120 ns×3×8192) before being read and the very last DRAM cell written has been held for about 2.96 milliseconds ((120 ns×3×8192)+(8192−1) before being read. Given a typical burn-in retention time specification of about 3 milliseconds, there is no retention time problem. However, if the clock cycle is 160 ns, then the times are 3.93 (160 ns×3×8192) milliseconds and 3.94 ((120 ns×3×8192)+(8192−1) milliseconds respectively there is a retention time problem.

FIG. 2 is a timing diagram for a related art method of performing a pattern burn-in test of a DRAM in DDR mode. In FIG. 2, each write sequence takes five clock cycles. A BA command is issued on the rising edge of the first clock. A WR is issued on the rising edge of the second clock. First data is presented and a first DQS issued during the rising edge of the third clock cycle. Second data is presented and a second DQS issued during the falling edge of the third clock cycle. Both first and second data are latched at the fourth clock cycle. These extra clock cycles between presentation of data and latching of data into the DRAM array are the internal write latency of the DRAM in DDR mode. During the rising edge of the fifth clock cycle, a PRE command is issued precharging the bitline to a known state so the bitline is ready for the next write command.

After all cells have been written, they are read out. Each read cycle takes four clock cycles. At the rising edge of the first clock a bank activate command is issued and at the rising edge of the second clock a RD command is issued. However, data is not present at the output of the bitline amplifiers until the rising edge of the fourth clock. This is again, the read CAS latency of the DRAM. A PRE command is issued on the rising edge of the fourth clock (after the data has been sensed) so the bitline is in a known state and ready for the next read command.

Again, the retention time specification must be considered. For example given a 160 ns clock cycle, 8192 wordlines, a 5 clock write cycle and a 4 clock read cycle, data in the very first DRAM cell written (which is the worst case) has been held by that cell for about 6.6 milliseconds (160 ns×5×8192) before being read. Given a typical burn-in retention time specification of about 3 milliseconds, there is a retention time problem. Examining the 120 ns clock cycle case, data in the very first DRAM cell written has been held by that cell for about 4.9 milliseconds (120 ns×5×8192) before being read. Again, there is a retention time problem.

The present invention requires a DDR DRAM switchable between a normal and burn-in mode. The burn-in mode requires functional modification of the DRAM peripheral logic circuits to change the timing of commands for external WR latency, RD CAS latency, WR Burst enable (WBE) and AP in burn-in mode but retain the specified timings in normal mode. The exact circuit modifications can vary from DRAM design to design; therefore, the changes are described in terms of circuit function. One of ordinary skill in the art would now how to modify a DRAM DDR circuit design to effect the changes to the timing of commands for WR latency, RD CAS latency, WR Burst enable (WBE) and AP in order to practice the present invention.

FIG. 3 is a timing diagram for a method of performing a pattern burn-in test of a DRAM in DDR mode according to the present invention. In FIG. 3, each write cycle takes two clock cycles. A BA command is issued on the rising edge of the first clock. A WR with auto-precharge (AP) command is issued on the rising edge of the second clock. First data is presented and a first DQS issued during the rising edge of the second clock cycle. Second data is presented and a second DQS issued during the falling edge of the second clock cycle. Both first and second data are latched during the second clock cycle. This removes the write latency of the DRAM otherwise present in DDR mode. The WR/AP command eliminates the need for a PRE command to be is issued to bring the bitline to a known state preparatory for the next write command. Two additional signals in FIG. 3 are the auto-precharge reset (APR) and WBE. WBE is issued just after the rising edge of the second clock and is completed before the falling edge of the second clock. APR is issued at the falling edge of the second clock and is completed before the rising edge of the first clock of the next write sequence.

After all cells have been written, they are read out. Each read sequence takes two clock cycles. At the rising edge of the first clock a bank activate command is issued and at the rising edge of the second clock a RD/AP command is issued. However, data is not present at the output of the bitline amplifiers until the rising edge of the first clock of the next read sequence. Thus, the RD CAS latency of the DRAM has been reduced from 2 to one clock cycles. A precharge command is issued on the falling edge of the second clock (after the data has been sensed) so the bitline is in a known state and ready for the next read command. The WR/AP command eliminates the need for a PRE command to be issued to bring the bitline to a known state preparatory for the next read command.

Again, the retention time specification must be considered, For example given a 120 ns clock cycle, 8192 wordlines, a 2 clock write cycle and a 2 clock read cycle, data in the very first DRAM cell written (which is the worst case) has been held by that cell for about 2.0 milliseconds (120 ns×2×8192) before being read. Given a typical burn-in retention time specification of about 3 milliseconds, there is no longer a potential retention time problem burning in a DDR DRAM. In the example of a 160 ns clock cycle, data in the very first DRAM cell written (has been held by that cell for about 2.6 milliseconds (160 ns×2×8192) before being read. Again, there is no longer a potential retention time problem burning in a DDR DRAM There are four functional modifications of the DDR DRAM peripheral logic circuits required to practice the present invention as summarized in Table I.

TABLE I

| Mod # | Result of Modification | Cycle Reduction | Logic Circuit Modification |
|---|---|---|---|
| 1 | Eliminate 1 CLK WR latency | 1 CLK per WR command | Shift WBE, BASEL and CADD one CLK earlier (BASEL = BA select) (CADD = Column address) |
| 2 | Reduce RD CAS latency from 2 to 1 CLK | 1 CLK per RD command | Eliminate 1 CLK of FIFO shifting (Change CAS latency from 2 or 3 CLKs to 1 CLK |
| 3 | Latch data same CLK it is received | 1 CLK per WR command | Same as (1) |
| 4 | Time AP off falling edge of CLK | 1 CLK per RD/WR command | No PRE command used |

The first modification eliminates the DDR write latency of 1 clock cycle from the DDR DRAM specification. The write latency is a power saving feature of the DDR DRAM specification that powers up the data receiving circuits of the DRAM only when need to receive external data. Since this is not an issue in burn-in mode, the write latency can be eliminated from the write sequence saving one clock cycle.

The second modification reduces the RD CAS latency from 2 CLK cycles to 1 CLK cycle. In normal mode the DDR DRAM array access time is not fast enough to allow a CAS latency of 1 CLK cycle at normal operating frequencies of 100 MHz or more. However, since burn-in is run at 0.83 MHz the access time of the array is not an issue. The long clock time (for example, 120 ns) used in burn-in offers a considerable timing margin for DRAM array access even with a RD CAS latency of 1 CLK cycle.

The third modification allows data to be latched into the DRAM array via the column select line (CSL) in the same clock cycle that data is received in. In normal mode, the DDR DRAM waits until the next rising edge after the last bit of data (which is always on a falling CLK edge) to latch the data into the DRAM array and start the write-back. The long burn-in CLK cycle time not only allows the write back to start earlier, but ensures that it will complete before the next CLK falling edge. Thus, 1 CLK cycle can be eliminated from the write sequence.

The fourth modification launches the auto-precharge from a CLK falling edge immediately after data write. (In burn-in mode, the auto-precharge is started a half CLK cycle earlier than in normal mode.) Depending on whether Timed Address Compression (TAC) is used or not, data may be "received" on a CLK rising edge (TAC mode) or both the rising and falling edges of the CLK (non-TAC mode). In TAC mode, the precharge is initiated immediately after the falling edge of the CLK because there is no data and hence no write-back delay is required. In non-TAC mode, a timer is used to allow enough time for the write-back and to start the auto-precharge asynchronously after the falling edge of a CLK. Half of the burn-in CLK time (for example, 60 ns) is more than enough time to accomplish both write-back and precharge, allowing a bank activate (and hence the beginning of a new write sequence) to occur on the next CLK rising edge. The long burn-in CLK cycle is long enough to complete a bitline precharge before the next CLK rising edge as well. Thus, by issuing a write with auto-precharge in non-TAC mode, a further reduction of the write sequence by 1 CLK cycle may be obtained. Read with auto-precharge in non-TAC mode may also be used.

Figure 4:
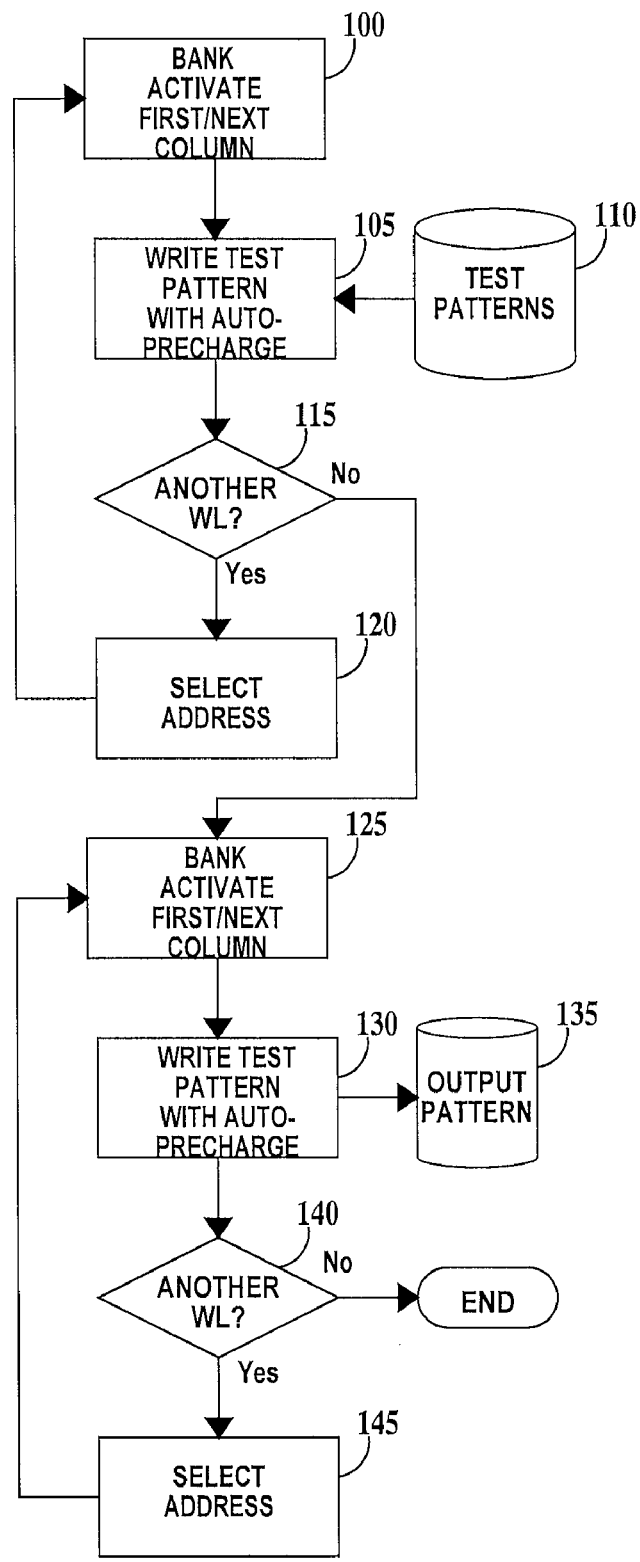
FIG. 4 is a flowchart for the method of performing a pattern burn-in test of a DRAM in DDR mode according to the present invention.

FIG. 4 is a flowchart for the method of performing a pattern burn-in test of a DRAM in DDR according to the present invention. The flowchart starts after a DRAM device has been brought up to burn-in temperature and has been connected to a tester. In step 100 a bank activate command is issued to activate the first/next wordline of the DRAM based on the address of the first/next wordline. In step 105, a test pattern from a test pattern file 110 is written to the bitlines of the DRAM array with auto-precharge. In step 115, it is determined if another wordline (WL) remains to be activated. If another wordline remains to be activated, then in step 120 the address of the next wordline is determined and the method loops back to step 100, otherwise the method proceeds to step 125. Each sequence of steps 100 through 120 consumes 2 burn-in CLK cycles.

In step 125 a bank activate command is issued to activate the first/next wordline of the DRAM based on the address of the first/next wordline. In step 130, the pattern stored on the activated wordline is read out through the bitlines of the DRAM and written to an output pattern file 135. In step 140, it is determined if another wordline (WL) remains to be activated. If another wordline remains to be activated, then in step 145 the address of the next wordline is determined and the method loops back to step 125, otherwise the method ends. Each sequence of steps 125 through 145 consumes 2 burn-in CLK cycles. Afterwards, the output patterns can be compared to the inputted test patterns to determine which DRAM cells are connected to defective wordlines or bitlines. Often these "defective" DRAM wordlines or bitlines can be replaced with known good redundant wordlines or bitlines.

Figure 5:
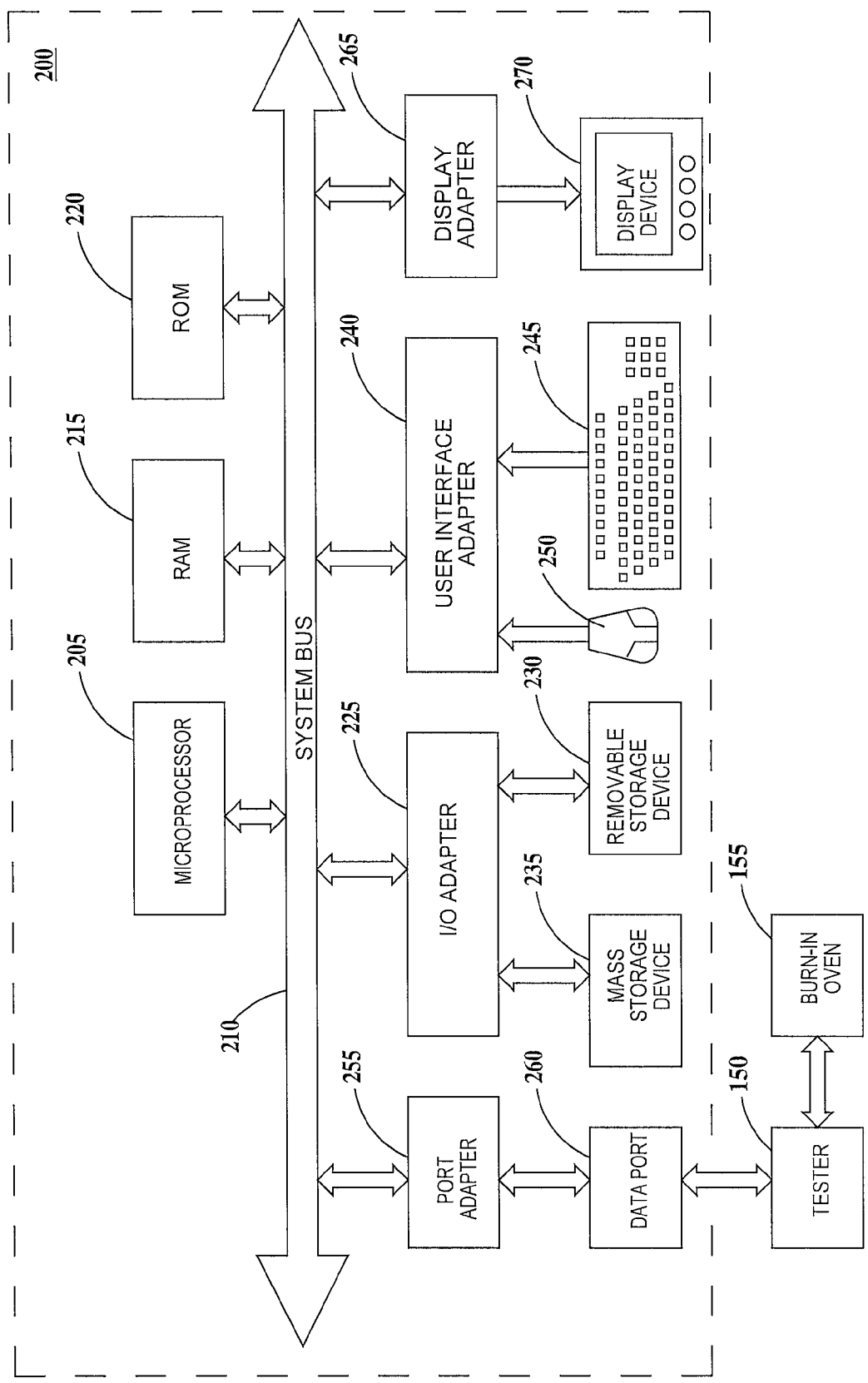
FIG. 5 is a schematic block diagram of a general-purpose computer for directing a tester in the performance of the present invention.

Generally, the method described herein with respect to a method of performing an insitu pattern burn-in test of a DRAM in DDR mode is practiced by a tester under the control of a general-purpose computer and the method may be coded as a set of instructions on removable or hard media for use by the general-purpose computer. FIG. 5 is a schematic block diagram of a general-purpose computer for directing a tester 150 connected to a DRAM in a burn-in oven 155 in the performance of the present invention. In FIG. 5, computer system 200 has at least one microprocessor or central processing unit (CPU) 205. CPU 205 is interconnected via a system bus 210 to a random access memory (RAM) 215, a read-only memory (ROM) 220, an input/output (I/O) adapter 225 for a connecting a removable data and/or program storage device 230 and a mass data and/or program storage device 235, a user interface adapter 240 for connecting a keyboard 245 and a mouse 250, a port adapter 255 for connecting a data port 260 and a display adapter 265 for connecting a display device 270.

ROM 220 contains the basic operating system for computer system 200. The operating system may alternatively reside in RAM 215 or elsewhere as is known in the art. Examples of removable data and/or program storage device 230 include magnetic media such as floppy drives and tape drives and optical media such as CD ROM drives. Examples of mass data and/or program storage device 235 include hard disk drives and non-volatile memory such as flash memory. In addition to keyboard 245 and mouse 250, other user input devices such as trackballs, writing tablets, pressure pads, microphones, light pens and position-sensing screen displays may be connected to user interface 240. Examples of display devices include cathode-ray tubes (CRT) and liquid crystal displays (LCD).

The DDR DRAM of the present invention may be used as a low frequency (or switchable low/high frequency) DDR DRAM in applications, for example, requiring very low power consumption. In one example low frequency operational mode is less than about 33 MHz and high frequency operational mode is greater than about 83 MHz.

A computer program with an appropriate application interface to tester 150 may be created by one of skill in the art and stored on the system or a data and/or program storage device to simplify the practicing of this invention. In operation, information for or the computer program created to run tester 150 is loaded on the appropriate removable data and/or program storage device 230, fed through data port 260 or typed in using keyboard 245.

Thus, the present invention provides a method of insitu pattern burn-in testing of DDR mode only DRAMs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. The DRR DRAM having a low frequency and a high frequency operating mode, comprising:
    a multiplicity of storage cells arranged in an array, each storage cell accessible by a wordline and a bitline;
    wherein peripheral logic circuits of said DDR DRAM are adapted to execute a write burst enable and a column address command one clock cycle earlier in low frequency operating mode than in high frequency operating mode, adapted to execute an auto-precharge enable one-half clock cycle earlier in low frequency operating mode than in high frequency operating mode, and having a column address latency of one clock cycle in test mode and two or three clock cycles in operational mode;
    wherein said DDR DRAM is adapted to initiate, in a timed auto-precharge mode of low frequency operational mode, a precharge immediately after a falling edge of a clock cycle; and
    wherein said DDR DRAM is adapted to, in a non-timed auto-precharge mode of said test mode, to start an auto-precharge asynchronously after the falling edge of a clock cycle and after a timer allows enough time for a write-back to said DDR DRAM.

2. The DDR DRAM of claim 1, wherein said DDR DRAM is operating at a clock frequency below about 33 MHz in low frequency mode and at a clock frequency above about 33 MHz in high frequency mode.

3. The DDR DRAM of claim 1, wherein writing to a particular storage cell takes two clock cycles in low frequency operational mode and five clock cycles in high frequency operational mode.

4. The DDR DRAM of claim 3, wherein said DDR DRAM, during writing to said particular storage cell in low frequency mode is responsive to a bank activate command during a first clock cycle and responsive to a write with auto-precharge command during a second clock cycle.

5. The DDR DRAM of claim 3, wherein said DDR DRAM, during reading from said particular storage cell in low frequency mode is responsive to a bank activate command during a first clock cycle, responsive to a write command during a second clock cycle and responsive to a precharge command during a fifth clock cycle.

6. The DDR DRAM of claim 1, wherein reading from a particular storage cell takes four clock cycles in both in low and high frequency operational modes.

* * * * *